United States Patent [19]

La Rocca et al.

[11] Patent Number: 4,600,881
[45] Date of Patent: Jul. 15, 1986

[54] WATTHOUR TEST CIRCUITRY

[75] Inventors: Angelo A. La Rocca; Anthony M. Osmanski, both of Hazelton, Pa.

[73] Assignee: Pennsylvania Power and Light Company, Allentown, Pa.

[21] Appl. No.: 482,569

[22] Filed: Apr. 6, 1983

[51] Int. Cl.$^4$ ............................................. G01R 35/04
[52] U.S. Cl. ...................................................... 324/74
[58] Field of Search ................. 324/74, 130; 364/483, 364/571; 331/1 A, 25

[56] References Cited

U.S. PATENT DOCUMENTS

| 2,938,165 | 5/1960 | Greig | 324/74 |
|---|---|---|---|
| 2,957,133 | 10/1960 | Burkhart, Jr. et al. | 324/74 |
| 3,217,267 | 11/1965 | Loposer | 331/1 A |
| 3,931,585 | 1/1976 | Barker et al. | 331/1 A |

FOREIGN PATENT DOCUMENTS 2368040  6/1978  France ................................. 324/74

OTHER PUBLICATIONS

Omachi, T. et al., "A Digital Phase Locked Loop...", Electronics and Communications in Japan, vol. 59-A, No. 6, Jun. 1976, pp. 27-36.
Walter, K., et al, "ERROTEST, an Error Calculator for Electricity Meters", Siemens Review, vol. 42, No. 2, Feb. 1975, pp. 58-61.
Gifford, R., "Automatic Tester for kWh Meters", Transmission and Distribution, Jun. 1974, pp. 54-57.
Clarke, J., "Audio Prescaler for Frequency Meters", Electronics Australia, Apr. 1980, pp. 56-58.
K. Walter, "A Digital Error Indicator for Electricity Meter Testing", Siemens Review, XXXIX (1972) No. 11, pp. 508-511.

Primary Examiner—Stewart J. Levy
Assistant Examiner—Stephen M. Baker
Attorney, Agent, or Firm—Z. T. Wobensmith, III

[57] ABSTRACT

The present invention accepts accurately generated pulses, having a frequency of K pulses per second, from a suitable source of such pulses, and uses those pulses to phase correct the operation of a phase lock loop voltage controlled oscillator, which is designed to run at a frequency of N times K pulses per second. The output pulses from the voltage controlled oscillator are passed along a bifurcated path. Along one leg of said bifurcated path, the pulses are directed to a counter where they are divided down to provide an output signal at the rate of NK/P pulses per second and in the preferred embodiment, P equals N. The pulses from the counter are fed at the NK/P rate back to a phase comparator which provides an error voltage at the voltage controlled oscillator for each pulse. The present invention further includes logic circuitry which is connected to the second of said bifurcated path legs to receive the pulses which are at the NK pulse per second rate and this logic circuitry is further connected to the output of the counter to receive pulses therefrom at the NK/P pulse per second rate. The logic circuitry is designed to be able to provide pulses at either the NK rate, or at the NK/P rate depending upon how the pulses are to be employed.

16 Claims, 4 Drawing Figures

WATTHOUR TEST CIRCUITRY

BACKGROUND

The use of watthour meters to determine the amount of electrical energy consumed by a customer is well known and is in widespread practice. The manufacturers of watthour meters have the continual problem of building a watthour meter and then calibrating it, that is, determining how different any given production watthour meter might be from a standard watthour meter. Such calibrations involve either adjusting the production watthour meters in the course of testing the same in order to have such production items approach the performance of a reference watthour meter, or, alternatively, providing a correction factor to be used with the read out of such production watthour meters.

In recent times, with the advent of electronic counters and electronic computers, it has become the practice to use a reference watthour meter which has been calibrated against a government standard watthour meter as a source of pulses. Usually the disk of such a standard watthour meter has had its edge serrated and such a disk is passed under a light source so that the beam of light therefrom is interrupted in accordance with the serrated edge. The interrupted light is transmitted to a light sensitive device and in accordance with the interruptions, there are electrical pulses generated, i.e., corresponding to the interruptions. In an alternative operation, holes are drilled in the disk and they serve the same purpose as the serrated edge, i.e. to provide interruptions to a light beam being passed through the holes in the disk. In such arrangements the pulses are electrically counted. The pulses are counted during a period which is commenced with a start signal, from the disk of the production meter under test, and stop being counted, in accordance with a stop signal from the disk of the meter under test. It follows that if the start and stop signal coincide with one revolution of the disk of the watthour meter under test, then the pulses counted should represent the number of pulses available during one complete excursion of the disk of the watthour meter under test. The number of the pulses so counted is compared with a desired number of pulses representing the number of pulses that would be available for a complete excursion of the disk of the standard watthour meter and any difference represents an inaccuracy of the production watthour meter (as compared with the standard watthour meter). Such an inaccuracy is the basis of an adjustment or of the provision of a factor to be used in the read out. Such a device is described in U.S. Pat. No. 2,938,165 issued to W. A. Greig.

Major problems exist with such techniques, that is the technique of using a standard watthour meter as the source of pulses. The degree of accuracy, that is the degree to which the difference between the standard watthour meter and the production watthour meter can be measured, is limited by the pulses which can be provided from the disk of the standard, or reference, watthour meter. In addition there are further limitations, such as the fact that an electromechanical watthour standard is insensitive to waveform distortion, and this is a source of errors. The further limitations also reside in the fact that an electromechanical watthour standard is sensitive to changes in temperature and to vibrations.

SUMMARY

The present invention is used with an accurate electronic watthour standard. The electronic watthour standard is designed to provide 1,000 pulses every 3.6 seconds which is the accepted frequency value for a standard watthour meter which is operating under full load. It should be understood that full load is defined as five amps and 120 volts, unity power factor. In other words, a standard watthour meter which has been calibrated against a government standard would provide 1,000 pulses every 3.6 seconds or every complete excursion of the disk provided that such disk had 1,000 holes therein to provide the basis for such pulses. The pulses from the electronic watthour standard are used to phase correct a voltage controlled oscillator which is designed to operate at (in the preferred embodiment) ten times the frequency of the pulses from the electronic watthour standard. The pulses from the electronic watthour standard are not used to be directly counted in a counter as was described above with the prior art. The output pulses from the voltage controlled oscillator are transmitted to a counter in response to start and stop signals from the disk of a production watthour meter, which is under test. When the counter is stopped in response to a stop signal, the pulse count in the counter is ten times what it might have been had the voltage controlled oscillator not been used as the source of pulses. The pulse value in the counter is then divided into a factor which has been preselected and which represents the number of pulses expected, had an ideal watthour meter been under test. The quotient is the percentage of accuracy in its raw value. For example, if the electronic watthour standard is providing 1,000 pulses in a given time frame, then the voltage controlled oscillator will provide 10,000 pulses to the counter, if indeed the start and stop signals from the disk of the production watthour meter were 3.6 seconds apart. Under such circumstances the 10,000 pulse value, representing the pulses from the electronic watthour standard, would be divided into a predetermined number which would be 100 times the ideal expected count (in this case 10,000). The value of the predetermined number in this case would be 1,000,000. Accordingly, if 10,000 pulses from the voltage oscillator were divided into the predetermined number (1,000,000), there would be a quotient of 100, which equals a comparison factor of 100 percent.

Because there are 10 times as many pulses available, or 10 pulses available to be counted between the electronic watthour standard pulses, the accuracy of the reading is dramatically increased. The voltage controlled oscillator's output is continuously corrected to provide exactly 10 times the electronic watthour standard pulses, which represent the input pulses of the system. In addition, the system includes means to enable the user to test a number of different types of production watthour meters which are known to operate at different design speeds, one from the other, and from the standard. In this last operation the watthour meters are designed to run at different speeds from the accepted reference and therefore a correction factor is needed to be employed with any read out from such watthour meters.

The objects and features of the present invention will be better understood in view of the following description taken in conjunction with the drawings in which.

Figure 1:
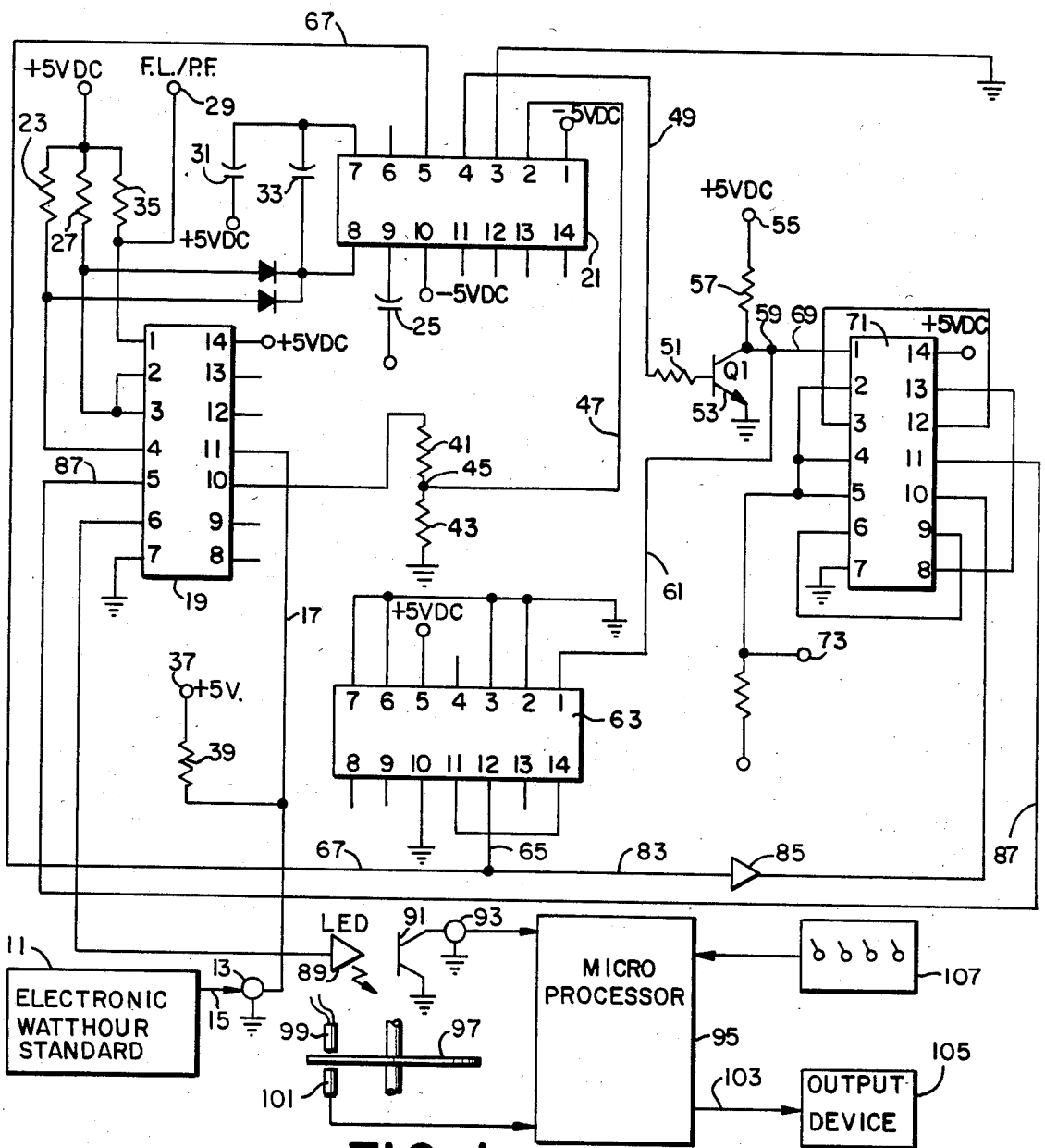
FIG. 1 is a block schematic diagram of the accurately generated pulse source circuitry.

Consider FIG. 1 which shows an electronic watthour standard 11 which provides pulses on the input channel 13. In the preferred embodiment the electronic watthour standard 11 is a Scientific Columbus SC-10 Watthour Meter standard. Other accurate electronic watthour standard devices could be used, provided however, that they are of equal stability and accuracy as that of the Scientific Columbus device. In the preferred embodiment the electronic watthour standard 11 provides 1,000 pulses every 3.6 seconds to the input channel 13. It should be understood that 1,000 pulses per 3.6 seconds is a value which is generally accepted in the watthour meter industry as the frequency of pulses that would be available from a standard or a reference watthour meter. The period of 3.6 seconds is the time of a revolution when a standard, or reference, watthour meter is operating at full load, as defined above.

Pulses from the electronic watthour standard 11 are transmitted along coaxial cable 15 to the input 13 and from there along the line 17 to pin 11 of the hex inverter 19. The hex inverter 19 in the preferred embodiment is a part number 7404 manufactured by National Semiconductor Corporation. Other suitable multiple inverter devices could be used.

Before we concern ourselves with what happens to the pulses which are delivered to pin 11 of the hex inverter 19, let us consider the phase lock loop voltage controlled oscillator 21. The phase lock loop voltage controlled oscillator which will be referred to throughout the description and the claims as the voltage controlled oscillator, in the preferred embodiment is a part number 565 manufactured by National Semiconductor Corporation. Other suitable voltage controlled oscillators could be used. Since there are many different designs of voltage controlled oscillators, it should be pointed out that the oscillation rate or the free running frequency rate of the voltage controlled oscillator 21 is determined by the combination of resistor 23 and capacitor 25, or is determined by the combination of resistor 27 and capacitor 25. The resistor 27 is used in the circuit, as will become clear hereinafter, when a zero potential, or ground potential, is applied to the terminal 29. On the other hand the resistor 23 is included in the circuit when there is a 5 volt d.c. potential applied to the terminal 29.

Figure 2:
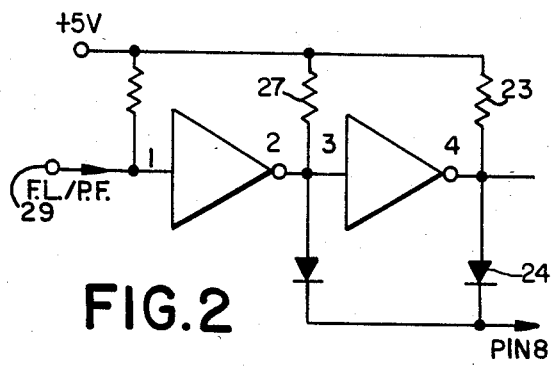
FIG. 2 is a partial schematic of a hex inverter device used in FIG. 1.

If we examine FIG. 2, we see a partial display of the arrangement of the inverters in the hex inverter 19. It can be seen in FIG. 2 that the resistors 23 and 27 are identified. It can be determined from an examination of FIG. 2 that when there is a zero potential applied to terminal 29, there is zero potential at pin 1 and hence there is approximately 5 volt potential at terminals 2 and 3 and hence a zero potential at terminal 4. Since the voltage at terminals 2 and 3 is something less than 5 volts, current will flow through the resistor 27 because the circuit sees a lower potential at pin 8 of the voltage controlled oscillator 21. On the other hand, because there is zero potential at pin 4 which reverse biases the diode 24, there will be no current flow through diode 24 which thereby isolates resistor 23 from the oscillator. Accordingly with zero potential, or 0.50 power factor determination under way, the resistor 27 will be in the circuit. Hence the free running frequency of the voltage controlled oscillator 21 will be determined in great measure by the RC time constant represented by the value of the resistor 27 and the value of the capacitor 25. On the other hand, in continuing to examine FIG. 2, we find that if there is a 5 volt signal applied to terminal 29, then there is zero potential at pins 2 and 3 while there is approximately 5 volts at pin 4. Under these circumstances, there will be current flow through the resistor 23 since the voltage at pin 4 is something less than 5 volts and the circuit sees a lower potential at pin 8 of the oscillator. Hence the value of resistor 23 and the value of capacitor 25 provide the RC time constant to determine the free running frequency of the voltage controlled oscillator 21. In the preferred embodiment, the resistors are chosen such that resistor 23 in combination with the capacitor 25 cause the voltage controlled oscillator to run at ten times the frequency of the pulses being applied from the electronic watthour standard 11. On the other hand, as mentioned earlier with 0.50 power factor determination under way, the circuit is designed that resistor 27 is employed with the circuit, and the combination of the resistor 27 and the capacitor 25 will cause the voltage controlled oscillator to operate at one half of the frequency at which it ran when five volts were applied to terminal 29. Nonetheless, the voltage controlled oscillator will be operating at ten times the frequency of the pulses being applied from the electronic watthour standard, since at 0.50 power factor pulses from the electronic watthour standard will be at a frequency of one half that of full load.

The capacitors 31 and 33 are included in the circuit to provide stability to the voltage controlled oscillator and the resistor 35 is provided in the circuit as a pull-up resistor for the terminal 29.

Each time the input 13 is at zero potential, there is current flow from the 5 volt terminal 37, through the resistor 39, to ground. Accordingly there is ground potential applied to the input of the inverter shown at pin 11. Ground potential at the input of the inverter shown at pin 11 provides a 5 volt output at pin 10 which provides current flow through the resistor 41 and through the resistor 43 to ground. Resistors 41 and 43 provide a voltage divider which provides a positive potential at point 45 when current is flowing through that resistor network. The positive potential at point 45, which represents a pulse, is transmitted on line 47 to pin 2 of the voltage controlled oscillator 21.

It will be recalled that the voltage controlled oscillator 21 is operating at a frequency which is ten times the frequency of the pulses from the electronic watthour standard 11. Accordingly, every pulse arriving at pin 2 provides a phase correction for the voltage controlled oscillator 21 and that phase correction takes place once for every ten output pulses from said voltage controlled oscillator 21. It is well understood that voltage controlled oscillators tend to drift. It should also be understood that ordinary electronic watthour standard pulse sources may tend to drift with variations in voltage and current. In the present situation, described thus far, the voltage controlled oscillator is phase corrected to keep in step with the accurately generated pulses from the electronic watthour standard.

Pin 4 of the voltage controlled oscillator 21 is the output terminal and hence the output pulses pass from pin 4 along line 49, through the resistor 51, to the base of the transistor 53. These pulses will be positive pulses and will turn on the transistor 53, each time a positive pulse arrives. When the transistor 53 is turned on, there will be current flow from the 5 volt terminal 55, through the resistor 57, and through the transistor 53. Accordingly the voltage drop across the transistor 53, will provide a pulse to the terminal 59, and therefrom along the line 61 to pin 1 of the counter 63. The counter 63 in the preferred embodiment is a part number 5490, manufactured by Texas Instruments Company. The pulses on line 61 advance the counter 63 and when the counter 63 has reached the value of ten, there will be an output from pin 12 on line 65. Accordingly, the train of pulses on line 61 are divided by ten to provide an output on line 65 every tenth input pulse. As such, the counter functions as a frequency modifier whereby the frequency of the input signal to the counter is modified so that an output signal having a different frequency is generated at the output of the counter.

The output pulses on line 65 are transmitted along one path 67, back to the voltage controlled oscillator 21, and in particular to pin 5 thereof. The pulses arriving at pin 5 provide a comparison between the output pulses and the input pulses on pin 2 and the difference between those two signals provides a phase correction to the voltage controlled oscillator 21. This phase correction provides an error voltage that is applied to the voltage controlled oscillator to keep it in "lock" with the incoming pulses applied from the electronic watthour standard to pin 2 of the phase locked loop 21. When the loop is in "lock" the output of the voltage controlled oscillator will be exactly 10 times the frequency of the pulses emanating from the electronic watthour standard 11.

Figure 3:
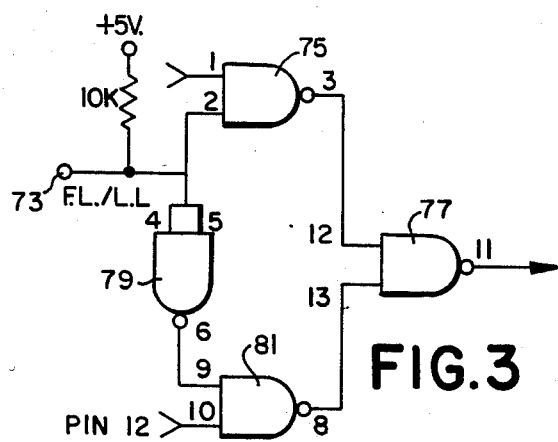
FIG. 3 shows logic circuitry employed as the output logic used in FIG. 1.

If we return to point 59, we find that there is a lead wire 69 therefrom, which is connected to pin 1 of the logic circuitry 71 which is configured to provide switching circuitry. The logic circuitry 71, in the preferred embodiment, is a part number 7400, manufactured by Texas Instruments Company. Other forms of logic devices could be used provided they are capable of performing the logic shown in FIG. 3. In FIG. 3, terminal 73 labeled F.L./L.L. is shown. The terminal 73, depending on what type of control input signal is applied thereto, provides a means for having the logic 71 direct pulses at ten times the frequency of the electronic watthour standard pulses or at the same frequency of the electronic watthour standard pulses, to the register of the microprocessor. The F.L. designation stands for full load while the L.L. designation stands for light load. Examine FIG. 3 wherein we find that if a full load is the mode of operation, that is the mode of the test, then 5 volts will be applied to terminal 73. With 5 volts applied to terminal 73, there will be a high signal on pin 2 of the NAND gate 75 and each time that there is a high pulse at terminal 59 (or on line 69) in FIG. 1, such high pulse will appear at the pin 1 of NAND gate 75. Hence there will be a low signal, or a ZERO at pin 3 for each high pulse on line 69. Accordingly, in the full load mode, the signal at pin 12, of the NAND gate 77 will be fluctuating between ZERO and ONE, the ZERO being present each time a pulse is emitted from the output of the voltage controlled oscillator at pin 4 thereof. In FIG. 3 in the full load mode, we find there are ONE signals to pins 4 and 5 of the NAND gate 79, hence there is a constant ZERO applied to pin 9 of the NAND gate 81. Hence, it makes no difference what signals are applied to pin 10 of the NAND gate 81, we find that in the full load mode, pin 8 of the NAND gate 81 will always be in the ONE condition. Since pin 8 and pin 13 are always in the ONE condition, in the full load mode of operation, the output at pin 11 will fluctuate from the ZERO condition to the ONE condition in accordance with the ONE or ZERO condition on pin 12 as previously described. Hence, the signals on pin 12 correspond to the high frequency signals, from the voltage controlled oscillator. Accordingly, we find that in the full load mode, the signals at pin 11 are the signals that correspond to the high frequency signals from the voltage controlled oscillator 21 of FIG. 1.

If we consider FIG. 3 again and consider the light load mode of operation, we find that in the light load mode there is a ZERO signal applied to pin 73 and hence there is a ZERO at pin 2 of the NAND gate 75. Therefore the NAND gate 75 is unresponsive to varying signals at pin 1. Accordingly, in the light load mode of operation, pin 3 and pin 12 are held constantly in a high or ONE state. On the other hand, the low or ZERO condition on terminal 73 provides two ZEROS, or low conditions, to the NAND gate 79 and hence there is a ONE at pin 6 and pin 9. If we examine FIG. 1, we find that from the line 65, (which comes from pin 12 of the counter 63), there is a line 83, which connects to pin 10 of the logic circuitry 71. That same pin, i.e., pin 10, is found in FIG. 3 being one of the input means of to the NAND gate 81. It will be recalled that the output signals on pin 12 of the counter 63 occur in response to every tenth input pulse to pin 1 of the counter 63. Hence, the counter 63 divides the high frequency input by ten and provides an output every tenth input signal. This divided down signal, or this every tenth signal, is applied to pin ten of the NAND gate 81 and hence, for every tenth high frequency signal there is a low frequency output signal on pin 8 and hence on pin 13 of the NAND gate 77. Accordingly, the output signal on pin 11 of the NAND gate 77 fluctuates in accordance with a low frequency signal at pin 13 and this provides a low frequency signal or a light load signal. It should be borne in mind with what we are dealing. In a light load test mode the watthour meter under test operates at rated voltage, but only 10% of rated current; thus, if such meter were ideal and tested under ideal conditions, it would take thirty-six seconds to make one revolution. The electronic watthour standard, on the other hand, always has full load voltage and full load current applied; therefore 1,000 pulses every 3.6 seconds are provided and thus in 36 seconds 10,000 pulses would have been counted, from counter 63. Hence 10,000 pulses are provided to the microprocessor under full load and light load tests.

If we look at FIG. 1, and in particular pin 11 of the logic device 71, we find that the output from pin 11 is on line 87 to pin 5 of the hex inverter 19. At pin 5 the signals are passed through the inverter, onto pin 6 and therefrom to the L.E.D. 89. The L.E.D. 89 provides light pulses to the light sensitive transistor 91. The light sensitive transistor 91 responds to provide electrical pulses along the line 93 to the microprocessor 95. The pulses on line 93 are received in a counter device, or a register, in microprocessor 95 and those pulses are accumulated into a binary signal value. In FIG. 1 there is shown a disk 97 which is the disk of the production watthour meter under test. We will assume that there is one hole drilled in this disk and that when that hole passes under the light source 99, it passes a light through the hole to the light sensitive device 101 which in turn provides a pulse into the microprocessor, where a bistable device is set. The bistable device indicates to the microprocessor that it may receive and count pulses from the cable 93. When the disk 97 completes a full rotation, or a full excursion, the light 99 will once again pass through the hole therein to energize the light sensitive device 101, which in turn will transmit a pulse to the microprocessor 95, and reset the bistable device to tell the microprocessor that it should no longer count, or receive, or store, the pulses coming from the cable 93. Hence, in the register in the microprocessor 95, the number of pulses from the voltage controlled oscillator, which have been received during the time that it received the start signal until the reception of the stop signal, represent the speed of the disk 97. If the disk 97 were operating at the ideal full load speed, then 10,000 such pulses should have been received and counted in the register in the microprocessor. The foregoing is based on the assumption that the input from the electronic watthour standard 11 is 1,000 per 3.6 seconds and that the voltage controlled oscillator is running at ten times that frequency. In the microprocessor 95, the stop signal will further energize logic which will compare the number of pulses received in the register with a prestored number, and in our particular case, 1,000,000. If, in fact, the system is to read out in percentage of comparison factor, then the microprocessor would divide the number of pulses received into 1,000,000, so that the quotient would automatically represent the percentage of comparison factor. In other words, if the register had received 9,850 pulses, and the ideal would have been 10,000 pulses, then the accuracy would be 1.0152 times 100 (to directly determine the persentage of comparison factor). In the microprocessor, if the 9,850 is divided into 1,000,000, the output is automatically 101.5% comparison factor, which is what the user in all probability wants to see. The foregoing output reading is transmitted from the microprocessor 95, along line 103, to the output device 105. The output device 105 might be a CRT or some display device, or indeed it may be a printer to provide a print out. In FIG. 1 there is further shown a selector device 107, which is shown to have four switches thereon. When a patticular one of these switches is set, then the value in the microprocessor which is compared with the input from line 93 is 1,000,000 as just described. However, if one of the other switches of the selector device 107 is turned on, then the microprocessor uses another value and that value is the value which provides the desired number against which the pulses received are compared.

Figure 4:
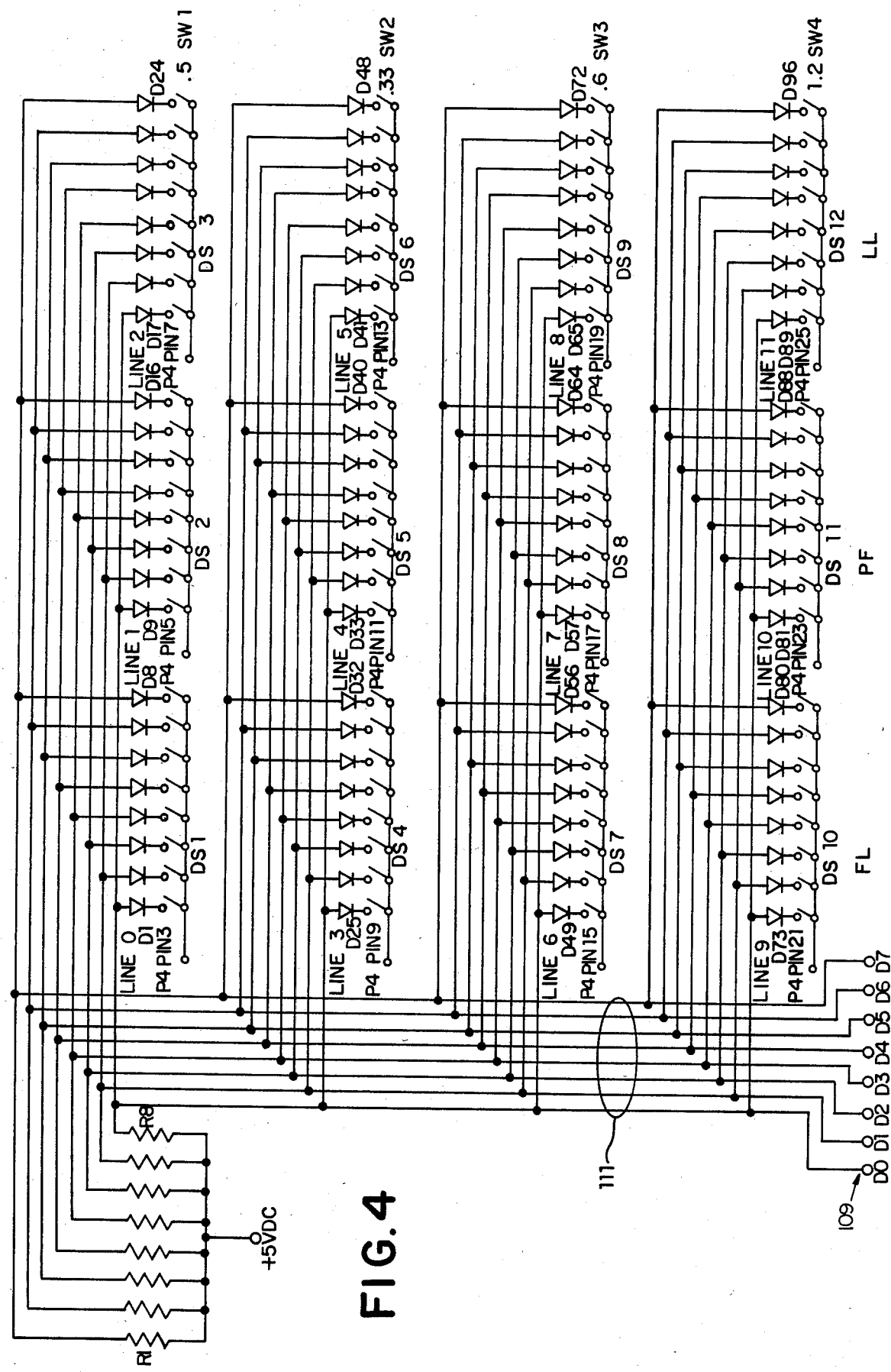
FIG. 4 shows the switching arrangement employed to enable the system to test different types of watthour meters.

FIG. 4 shows circuitry used in the preferred embodiment for the selector 107. As can be seen in FIG. 4, there are four switches, the first being for the 0.5 speed selection, the second being for the one-third speed selection, the third being for the 0.6 speed selection, and the fourth being for the 1.2 speed selection. In the watthour meter industry, certain watthour meters are designed to operate at speeds less than or greater than the accepted standard speed, which would provide 1,000 pulses in 3.6 seconds. If, in fact, the production meter, which is known to function at one-half of that speed, which corresponds to 1.2 speed selection were being tested, then switch SW4 would be closed and the pins in the DS10, DS11, and DS12 array would be closed. While these pins are shown to close in every position, in fact they do not close in every position, in that it depends on the number that is to be placed onto the output terminals 109. When the system is testing a 1.2 speed device and switch 4 is closed and the system is in the full load mode of testing, then pin 21 will have zero potential applied thereto, so that every switch which is closed will provide circuitry which will conduct. Hence associated lines of such closed contacts, going to the terminals 109, will be drawn down to ZERO potential. The other lines will have 5 volts potential thereon. Pin 23, DS11 will have 5 volts applied thereto and pin 25, DS12 will have 5 volts applied thereto, so that only the switch DS10 will be effective with respect to the lines 111 which are connected to the terminals 109. Each of the sets of switches in the array works the same way. Accordingly the circuitry shown in the FIG. 4 enables the system to test for three conditions, namely full load, 0.50 power factor, and light load and enables the system to test for four different speed production watthour meters in those three modes of operation.

The present system for testing production watthour meters has the advantage of not relying upon a watthour meter itself as the source of pulses to be made available between an on and off pulse of a production watthour meter in the test and has the advantage of providing an input pulse count which is ten times the accepted, or desired count, of pulses. While the system is shown to be operative at ten times the count, it could be operated at some other factor such as 100 times the desired count. The availability of the large number of pulses, from the voltage controlled oscillator makes the present system capable of reading to 1/100 of 1% accuracy, which degree of accuracy is not available in the prior art. In addition the present system has the flexibility of providing three modes of operation namely, full load, 0.50 power factor, and light load and the further flexibility of being able to test numerous types of watthour meters, where the types are designated by fractions or percentages of the design speed of the accepted standard.

We claim:

1. A circuit for providing accurately generated electrical pulses to electronic data processing means adapted to compare the electrical pulses with a predetermined reference to provide error in calibration of an energy meter comprising: a source of first pulses which provides electrical pulses at K pulses per second; a phase lock loop voltage controlled oscillator which is formed to generate pulses at N times K pulses per second to increase the frequency of the pulses from the source and which phase lock loop voltage controlled oscillator has a least first and second input means and at least one output means; first circuitry means connecting said source of first pulses to said first input means of said phase lock loop voltage controlled oscillator; counter circuitry having at least one input means and at least one output means, said counter circuitry formed to provide an output pulse on said output means in response to every P number of pulses received by said input means thereof; second circuitry means connecting said output means of said phase lock loop voltage controlled oscillator to said input means of said counter circuitry so that pulses from the output means of the oscillator are transmitted to the input means of the counter circuitry at the rate of NK pulses per second and in response the counter circuitry produces pulses at its output means at the rate of NK/P pulses per second; third circuitry means connecting said output means of said counter circuitry to said second input means of said voltage controlled oscillator to phase correct said voltage controlled oscillator in response to pulses supplied from said output means of said counter circuitry; logic circuitry means having a first input means coupled to said second circuitry means to receive pulses from the oscillator, a second input means coupled to said output means of said counter circuitry to receive pulses from the counter circuitry, a control signal input means, and at least one output means coupled with the electronic data processing means, said logic circuitry means formed to provide a first output of N times K pulses per second from the pulses received from the oscillator and a second output of NK/P pulses per second from the pulses received from the counter circuitry, alternatively, at said output means of said logic circuitry means in response to control input signals supplied to said control signal input means so that the alternative first and second outputs of the logic circuitry means may be alternatively transmitted to the electronic data processing means.

2. A circuit to provide accurately generated electrical pulses according to claim 1 wherein the value of N equals the value of P.

3. A circuit to provide accurately generated electrical pulses according to claim 1 comprising circuitry means having an R-C circuit connected with the phase lock loop voltage controlled oscillator for determining the frequency of the output signal from the phase lock loop voltage controlled oscillator.

4. A circuit to provide accurately generated electrical pulses according to claim 3 wherein said R-C circuit includes at least first and second resistors and whereby when said first resistor has current passing therethrough said output signal of said oscillator has a first frequency and when said second resistor has current passing therethrough said output signal has a second frequency.

5. A circuit to provide accurately generated electrical pulses according to claim 1 wherein said first circuitry means includes a hex inverter and a voltage divider network connected with said hex inverter.

6. A circuit to provide accurately generated electrical pulses according to claim 1 wherein said second circuitry means includes a transistor whose base element is connected to said output means of said voltage controlled oscillator and whose collector element is connected to said input means of said counter circuitry.

7. A circuit to provide accurately generated electrical pulses according to claim 1 wherein said source of first pulses comprises an electronic energy standard.

8. A system to calibrate a production energy meter having a rotatable disk comprising: a source of first pulses which provides electrical pulses at K pulses per second; a phase lock loop voltage controlled oscillator which is formed to generate pulses at N times K pulses per second to increase the frequency of the pulses from the source and which voltage controlled oscillator has a least first and second input means and at least one output means; first circuitry means connecting said source of first pulses to said first input means of said voltage controlled oscillator; counter circuitry having at least one input means and at least one output means, said counter circuitry formed to provide an output pulse on said output means in response to every P number of pulses received by said input means thereof; second circuitry means connecting said output means of said voltage controlled oscillator to said input means of said counter circuitry so that pulses from the output means of the oscillator are transmitted to the input means of the counter circuitry means at the rate of NK pulses per second and in response the counter circuitry produces pulses at its output means at the rate of NK/P pulses per second; third circuitry means connecting said output means of said counter circuitry to said second input means of said voltage controlled oscillator to phase correct said voltage controlled oscillator in response to pulses supplied from said output means of said counter circuitry; logic circuitry means having a first input means coupled to said second circuitry means to receive pulses from the oscillator, a second input means coupled to said output means of said counter circuitry to receive pulses from the counter circuitry, a control signal input means, and at least one output means coupled with the electronic data processing means, said logic circuitry means formed to provide a first output of N times K pulses per second from the pulses received from the oscillator and, alternatively, a second output of NK/P pulses per second from the pulses received from the counter circuitry, at said output means of the logic circuitry means in response to control input signals supplied to said control signal input means; processor means including a processor counter formed to count pulses, control means to start and stop said processor counter, memory means, and comparison means to compare a value counted by said processor counter with a reference value stored in said memory means; fourth circuitry means connecting said output means of said logic circuitry to said processor means to provide said processor means with pulses to be counted; signal means operating with said energy meter to be calibrated to provide a start signal when said energy meter starts a revolution of its disk and a stop signal when said energy meter completes a revolution of its disk; fifth circuitry means connecting said signal means to said processor means to cause said processor counter to start and stop counting said pulses from said logic circuitry and to cause said comparison means to compare the value counted by said processor counter with the reference value in said memory means; and output display means connected to said processor means to display the results of said comparison.

9. A system to calibrate a production energy meter according to claim 8 wherein said reference value in said memory means is 100 times the value of N times K and wherein said comparison means divides said value of the pulses counted by said processor counter into said reference value.

10. A system to calibrate a production energy meter according to claim 8 comprising selectable sets of resistors and wherein said selectable sets of resistors are formed and connected to provide selected values of said reference values to be stored in the memory means to accommodate calibrating energy meters which are designed to operate at different speeds.

11. A system for providing an error in calibration of an energy meter having a rotatable disk comprising:
  (a) a source for generating a signal of pulses at frequency K;
  (b) a frequency multiplier having an input coupled with the source and an output, said multiplier receiving the signal of pulses at frequency K from the source at its input and producing an output signal of pulses at frequency NK at its output to increase the frequency of the pulses from the source;
  (c) a frequency modifier having an input coupled with the output of the multiplier and an output, the frequency modifier receiving the output signal of pulses at frequency NK from the multiplier at the input of the frequency modifier and producing a modified output signal of pulses at frequency NK/P at the output of the frequency modifier;

(d) switch means having a first input coupled with the output of the multiplier to receive the output signal from the multiplier, a second input coupled with the output of the frequency modifier to receive the modified output signal from the frequency modifier, output means for producing an output from the switch means, and input control means for receiving a selected control input to switch the output of the switch means alternatively between the respective signals received by the first and second inputs of the switch means;

(e) detector means cooperating with the rotatable disk of the energy meter for detecting rotational movement of the rotatable disk;

(f) processor means coupled with the detector means and with the output means of the switch means to count the number of pulses from the respective signal produced at the output means of the switch means for a predetermined rotational movement of the rotatable disk; and (g) comparator means for comparing the number of pulses counted with a reference value to provide error in calibration.

12. A system in accordance with claim 11 wherein the value of N equals the value of P.

13. The system in accordance with claim 11 wherein said switch means is configured so that a first control input causes the signal supplied to the first input of the switch means to be produced at the output means thereof and a second control input causes the signal supplied to the second input of the switch means to be produced at the output means thereof and wherein the first control input is supplied to the switch means for a first rotational velocity of the rotatable disk and the second control input is supplied to the swtich means for a second rotational velocity of the disk.

14. The system in accordance with claim 13 wherein the multiplier and the frequency modifier are configured to produce output signals of frequencies NK and NK/P, respectively, at selected respective frequency rates so that the processor means will count the same number of pulses for a selected rotational displacement of the disk for each of the first and second control inputs.

15. The system in accordance with claim 13 comprising circuitry means connected with the multiplier and the frequency modifier to cause the frequencies NK and NK/P of the respective output signals to be produced at selected respective frequency rates so that the processor means counts the same number of pulses for a selected rotational displacement of the disk for each of the first and second control inputs.

16. The system in accordance with claim 11 wherein the multiplier comprises an oscillator and said system comprises circuitry means connected with the oscillator to provide a phase correction signal to the oscillator to hold the output signal of the oscillator in phase.

* * * * *